United States Patent
Tan et al.

(10) Patent No.: US 10,404,337 B1
(45) Date of Patent: Sep. 3, 2019

(54) APPARATUSES AND METHODS OF USER EQUIPMENT SPECIFIC CODEBOOK DESIGN

(71) Applicant: NOKIA TECHNOLOGIES OY, Espoo (FI)

(72) Inventors: Jun Tan, Lake Zurich, IL (US); William Hillery, Lafayette, IN (US); Eugene Visotsky, Buffalo Grove, IL (US); Fred Vook, Schaumburg, IL (US)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 16/054,444

(22) Filed: Aug. 3, 2018

(51) Int. Cl.
*H04B 7/0456* (2017.01)
*G01R 29/10* (2006.01)
*H04L 27/26* (2006.01)
*H04B 17/19* (2015.01)
*H04B 17/10* (2015.01)

(52) U.S. Cl.
CPC .......... *H04B 7/0469* (2013.01); *G01R 29/10* (2013.01); *H04B 17/104* (2015.01); *H04B 17/19* (2015.01); *H04L 27/265* (2013.01)

(58) Field of Classification Search
CPC ............................ H04B 7/0639; H04B 7/0456
USPC .................................................. 375/260, 295
See application file for complete search history.

(56) References Cited

U.S. PATENT DOCUMENTS

| 2007/0210974 A1* | 9/2007 | Chiang | H01Q 19/32 343/757 |
| 2013/0028341 A1* | 1/2013 | Ayach | H04B 7/0478 375/267 |
| 2013/0202015 A1* | 8/2013 | Frank | H04B 7/0632 375/219 |

* cited by examiner

*Primary Examiner* — Kevin Kim
(74) *Attorney, Agent, or Firm* — Squire Patton Boggs (US) LLP (57) ABSTRACT

Systems, methods, apparatuses, and computer program products for a UE-specific codebook design are provided. One method may include determining, by a network node, variable spacing between antenna elements of a user equipment. The method may also include configuring user equipment specific precoders based on the variable spacing between the user equipment antenna elements.

20 Claims, 8 Drawing Sheets

APPARATUSES AND METHODS OF USER EQUIPMENT SPECIFIC CODEBOOK DESIGN

FIELD

Some example embodiments may generally relate to mobile or wireless telecommunication systems, such as Long Term Evolution (LTE) or fifth generation (5G) radio access technology or new radio (NR) access technology, or other communications systems. For example, certain embodiments may relate to codebook design in such systems.

BACKGROUND

Examples of mobile or wireless telecommunication systems may include the Universal Mobile Telecommunications System (UMTS) Terrestrial Radio Access Network (UTRAN), Long Term Evolution (LTE) Evolved UTRAN (E-UTRAN), LTE-Advanced (LTE-A), MulteFire, LTE-A Pro, and/or fifth generation (5G) radio access technology or new radio (NR) access technology. Fifth generation (5G) or new radio (NR) wireless systems refer to the next generation (NG) of radio systems and network architecture. It is estimated that NR will provide bitrates on the order of 10-20 Gbit/s or higher, and will support at least enhanced mobile broadband (eMBB) and ultra-reliable low-latency-communication (URLLC) as well as massive machine type communication (mMTC). NR is expected to deliver extreme broadband and ultra-robust, low latency connectivity and massive networking to support the Internet of Things (IoT). With IoT and machine-to-machine (M2M) communication becoming more widespread, there will be a growing need for networks that meet the needs of lower power, low data rate, and long battery life. It is noted that, in 5G or NR, the nodes that can provide radio access functionality to a user equipment (i.e., similar to Node B in E-UTRAN or eNB in LTE) may be referred to as a next generation or 5G Node B (gNB).

SUMMARY

One embodiment is directed to a method that may include determining, by a network node, variable spacing between antenna elements of a user equipment. The method may also include configuring user equipment specific precoders based on the variable spacing between the user equipment antenna elements.

Another embodiment is directed to an apparatus including at least one processor and at least one memory comprising computer program code. The at least one memory and computer program code configured, with the at least one processor, to cause the apparatus at least to determine variable spacing between antenna elements of a user equipment, and to configure user equipment specific precoders based on the variable spacing between the user equipment antenna elements.

Another embodiment is directed to an apparatus that may include means for determining variable spacing between antenna elements of a user equipment, and means for configuring user equipment specific precoders based on the variable spacing between the user equipment antenna elements.

Another embodiment is directed to an apparatus that may include circuitry configured to determine variable spacing between antenna elements of a user equipment, and circuitry configured to configure user equipment specific precoders based on the variable spacing between the user equipment antenna elements.

Another embodiment is directed to a non-transitory computer readable medium comprising program instructions stored thereon for performing at least the following: determining variable spacing between antenna elements of a user equipment, and configuring user equipment specific precoders based on the variable spacing between the user equipment antenna elements.

In certain embodiments, the determining of the variable spacing between the antenna elements may be based on at least one of: signaling the spacing between the user equipment antennas from at least one of the user equipment and the network, and/or estimating the spacing between the user equipment antenna elements at the user equipment or the network, or knowing the spacing between the user equipment antennas at the user equipment or the network.

In some embodiments, the antenna elements are transmit antennas. In certain embodiments, the configuring of the user equipment specific precoders may be based on non-uniformly sampled Fourier matrix being a function of the variable spacing between antenna elements of the user equipment.

In some embodiments, the configuring of the user equipment specific precoders may include obtaining the user equipment specific precoders by applying a non-uniformly sampled Fourier matrix to a desired emission pattern.

In certain embodiments, the estimating of the distance between antenna elements may include estimating the spacing between the user equipment antenna elements with receipt of a downlink transmission by switching the user equipment's receiver antennas or switching precoders.

In some embodiments, the estimating of the distance between antenna elements may include estimating the spacing between the user equipment antenna elements based on multiple receipts of sounding reference signal.

In certain embodiments, the method may also include signaling the user equipment specific precoders to another node in the network. In some embodiments, the method may also include at least one of: performing, by the user equipment, a transmission from multiple antenna elements with said precoders, and/or performing, by a network node, a reception of a transmission with said precoders at multiple antenna elements.

Another embodiment is directed to a method that may include determining a set of variable spacing between transmit antennas of a user equipment, and signaling the determined variable antenna spacing to another node in the network.

Another embodiment is directed to an apparatus including at least one processor and at least one memory comprising computer program code. The at least one memory and computer program code configured, with the at least one processor, to cause the apparatus at least to determine a set of variable spacing between transmit antennas of a user equipment, and to signal the determined variable antenna spacing to another node in the network.

Another embodiment is directed to an apparatus that may include means for determining a set of variable spacing between transmit antennas of a user equipment, and means for signaling the determined variable antenna spacing to another node in the network.

Another embodiment is directed to an apparatus that may include circuitry configured to determine a set of variable spacing between transmit antennas of a user equipment, and circuitry configured to signal the determined variable antenna spacing to another node in the network.

Another embodiment is directed to a non-transitory computer readable medium comprising program instructions stored thereon for performing at least the following: determining a set of variable spacing between transmit antennas of a user equipment, and signaling the determined variable antenna spacing to another node in the network.

In some embodiments, the determination of the set of variable spacing may be based on estimation of the variable spacing between the antennas at the user equipment or at a gNB.

BRIEF DESCRIPTION OF THE DRAWINGS

For proper understanding of example embodiments, reference should be made to the accompanying drawings, wherein.

DETAILED DESCRIPTION

It will be readily understood that the components of certain example embodiments, as generally described and illustrated in the figures herein, may be arranged and designed in a wide variety of different configurations. Thus, the following detailed description of some example embodiments of systems, methods, apparatuses, and computer program products for a UE-specific codebook design, is not intended to limit the scope of certain embodiments but is representative of selected example embodiments.

The features, structures, or characteristics of example embodiments described throughout this specification may be combined in any suitable manner in one or more example embodiments. For example, the usage of the phrases "certain embodiments," "some embodiments," or other similar language, throughout this specification refers to the fact that a particular feature, structure, or characteristic described in connection with an embodiment may be included in at least one embodiment. Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more example embodiments.

Additionally, if desired, the different functions or steps discussed below may be performed in a different order and/or concurrently with each other. Furthermore, if desired, one or more of the described functions or steps may be optional or may be combined. As such, the following description should be considered as merely illustrative of the principles and teachings of certain example embodiments, and not in limitation thereof.

As used with respect to certain embodiments described herein, a codebook may refer to the look-up table of cross coupling factors used for precoding. The codebook may be shared by the UE and the network.

The uplink multiple-input multiple-output (MIMO) design of third generation partnership project (3GPP) Rel-15 New Radio (NR) has two transmission schemes: a codebook based transmission scheme and a non-codebook based transmission scheme. Uplink (UL) codebooks are designed to support codebook (CB)-based uplink transmission up to four transmitters (4Tx). The non-CB based transmission is based on multiple sounding reference signal (SRS) transmission and UE transmitter (Tx)/receiver (Rx) reciprocity to yield uplink transmit precoders.

The codebook based transmission scheme would be the primary choice for NR uplink MIMO. This scheme requires that a gNB measures uplink SRS transmission to determine UL precoder candidates. The gNB selects the UE specific uplink precoder from the codebook through Transmitted Precoding Matrix Indicator (TPMI) indication in downlink control information (DCI). The Physical Uplink Shared Channel (PUSCH) transmission may use the indicated precoder from the DCI indication. Table 1 below shows Rel-15 NR uplink codebook design principle.

TABLE 1

| # of Tx | Waveform | Codebooks |
|---|---|---|
| 2 | DFT-S-OFDM | Rank 1 LTE codebook |
|  | CP-OFDM | Rank 1 and Rank 2 LTE codebook |
|  | DFT-S-OFDM | Rank 1 LTE codebook |
| 4 | CP-OFDM | A subset of NR DL 4Tx codebook with additional precoders |

As shown in Table 1, for 4Tx cyclic prefix (CP)-Orthogonal Frequency Division Multiplexing (OFDM), the uplink codebook design follows the NR downlink (DL) 4Tx codebook. The general rule of codebook design is based on discrete Fourier transform (DFT) precoding, which is based on uniform linear array (ULA) precoding.

The ULA (either 1D or 2D) is usually assumed for DL codebook design. It is generally assumed that all Tx antenna elements are uniformly placed where the distance between two neighbouring antenna elements is constant (half wavelength or multiple of half wavelength). However, such an assumption, in general, will not hold for uplink in UE's implementation.

Thus, certain embodiments described herein may be configured to address the non-uniform antenna placement issue for uplink codebook design.

Figure 1:
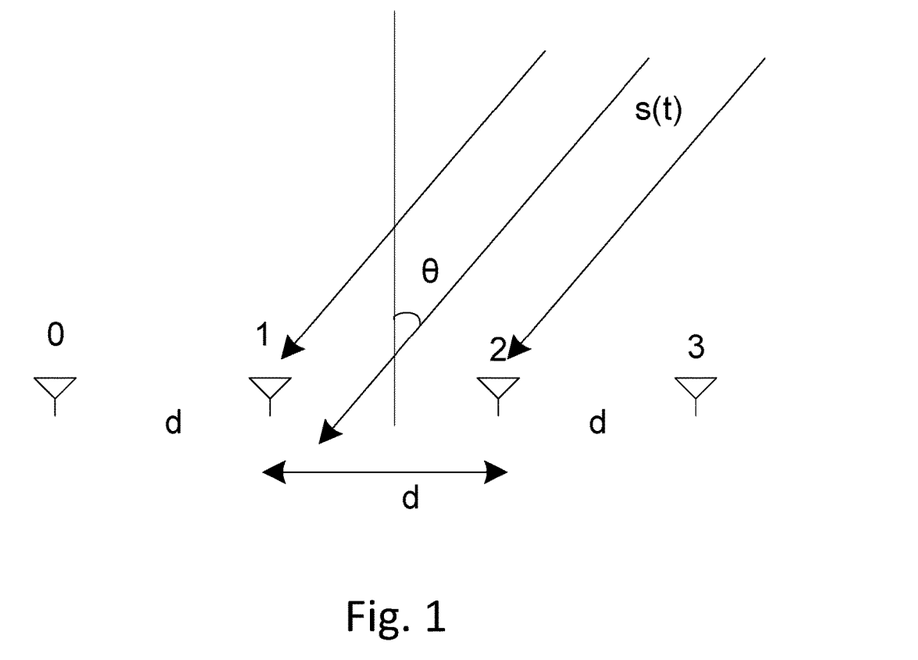
FIG. 1 illustrates an example of a uniform linear array (ULA), according to certain embodiments.

ULA is usually used for codebook based design for NR downlink. FIG. 1 illustrates an example model of ULA, with angle-of-arrival (AoA) θ for the transmitted/received signal s(t), and uniform antenna spacing of d.

The codebook design for the NR uplink may be based on an approach similar to that used for the DL codebook design, as indicated in Table 1. With the ULA model, the radiated or emission pattern may be formulated as:

$$y(\theta) = \sum_{n=0}^{N-1} w_n e^{j2\pi \frac{d}{\lambda} n \sin\theta},$$

where d is the antenna spacing, λ is the frequency carrier wavelength, $w_n$ is the precoding weight at the n-th antenna element, and N is the number of antenna elements.

The Fourier transform based design usually assumes $$\frac{1}{2}\lambda$$

(halt of carrier wavelength) antenna spacing, that is, $$\frac{d}{\lambda} = 0.5.$$

The emission pattern with respect to angle θ becomes:

$$y(\theta) = \sum_{n=0}^{N-1} w_n e^{j\pi n \sin\theta}.$$

One example codebook design can be illustrated with N=4 precoders as:

$$P_0 = \begin{bmatrix} 1 \\ 1 \\ 1 \\ 1 \end{bmatrix}, P_1 = \begin{bmatrix} 1 \\ -j \\ -1 \\ j \end{bmatrix}, P_2 = \begin{bmatrix} 1 \\ -1 \\ 1 \\ -1 \end{bmatrix}, P_3 = \begin{bmatrix} 1 \\ j \\ -1 \\ -j \end{bmatrix}$$

Figure 2:
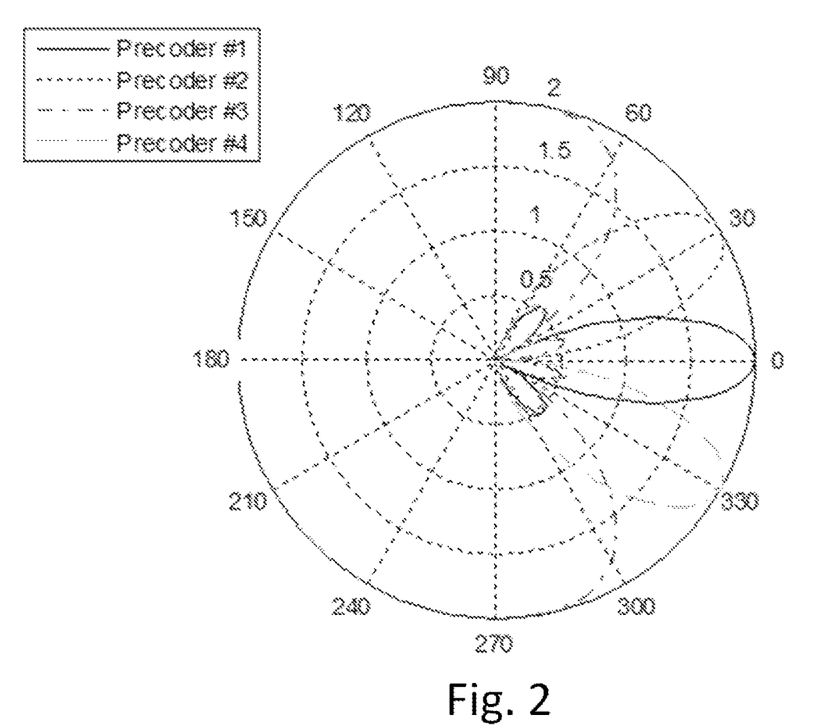
FIG. 2 illustrates an example of emission patterns of 4 Tx with 4 precoders, according to certain embodiments.

FIG. 2 illustrates example emission patterns of an example codebook design, with four precoders with antenna spacing (0, ½, ½, ½) λ. The emission patterns of precoders may be uniformly covered in spatial domain. However, the half-lambda antenna spacing may be hard to maintain for UE implementation, or at least not all Tx antenna spacing can be nicely located with half-lambda spacing, especially for carrier frequency <6 GHz, where λ >5 cm. These implementation issues will impact uplink MIMO performance when the codebook of half-λ is applied.

Figure 3:
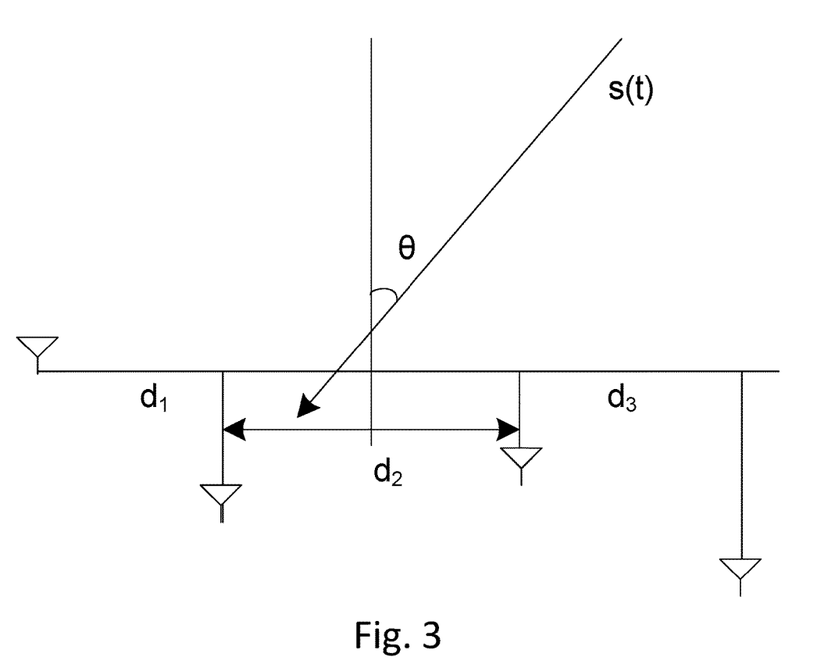
FIG. 3 illustrates one example of UE transmit antenna locations, according to certain embodiments.

FIG. 3 illustrates an example UE Tx antenna location. Arbitrary locations of Tx antennas may be considered for codebook based uplink transmission, such as the example illustrated in FIG. 3, where 4 Tx antennas are "arbitrarily" placed. The AoA between the radiating/receiving signal and a projected reference line is θ. The antenna distances in the projected reference line are $d_1$, $d_2$, $d_3$, as indicated in FIG. 3.

Figure 4:
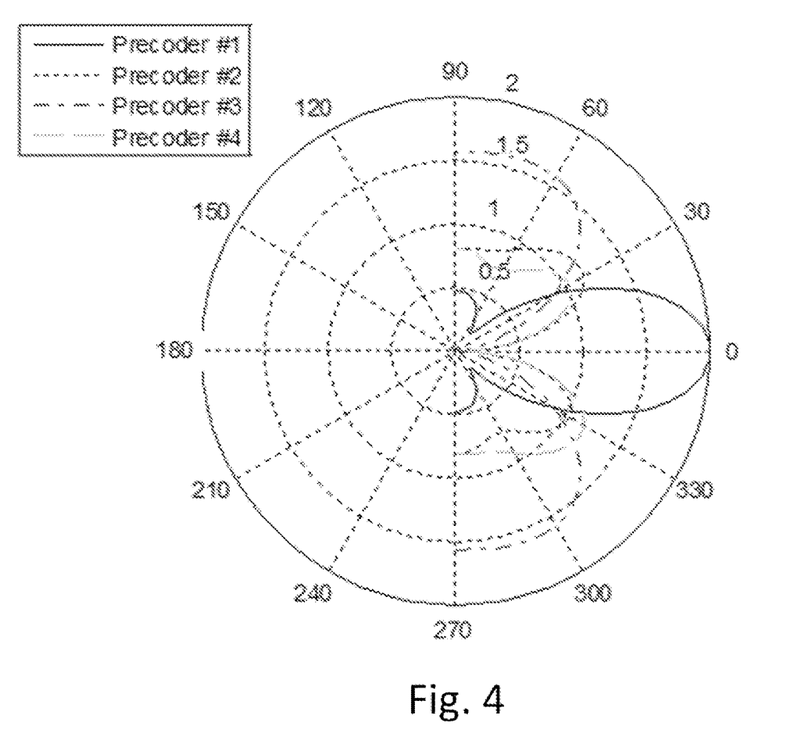
FIG. 4 illustrates another example of emission patterns of 4 Tx with 4 precoders, according to certain embodiments.

One example of a linear antenna array may have the antenna spacing of $(d_1, d_2, d_3)=(0.6, 0.5, 0.1)\lambda$. FIG. 4 illustrates an example of the emission patterns when the precoders $P_0, \ldots, P_3$ of codebook are applied to these antenna elements.

The emission pattern shown in FIG. 4 is not as optimal as that in FIG. 2. The arbitrary antenna distances distorted the emission pattern with the assumption of ULA. The precoders $P_1$, $P_2$, $P_3$ would have poorer performance than the ULA case shown in FIG. 2.

Figure 5:
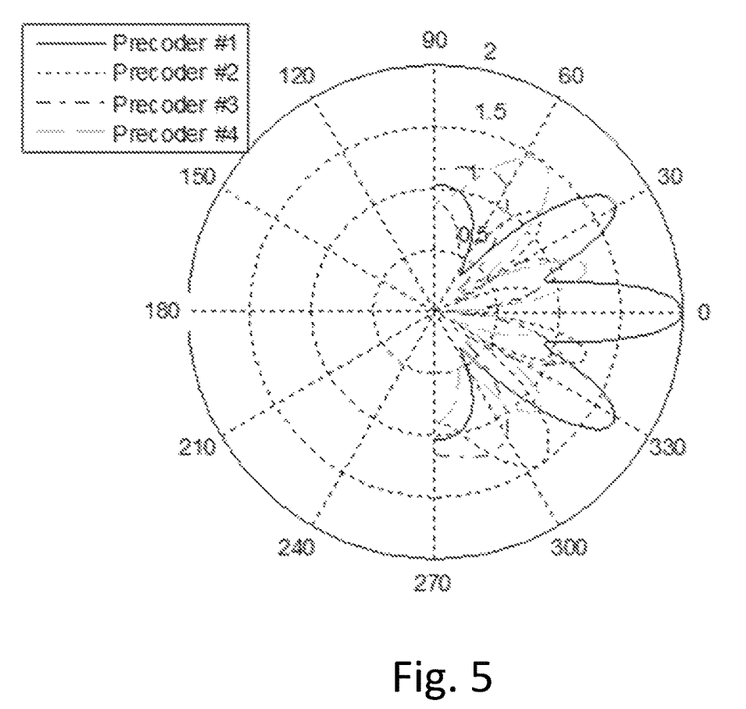
FIG. 5 illustrates another example of emission patterns of 4 Tx with 4 precoders, according to certain embodiments.

Another example spacing may be $(d_1, d_2, d_3)=(0.1, 1.0, 0.3)\lambda$. FIG. 5 illustrates example emission patterns for this example spacing.

These emission patterns illustrate the non-uniform performance of precoders. In this example, precoder $P_0$ will likely be selected with a large spatial domain while other precoders are seldom used. The large spreading angle of $P_0$ will generate a higher level of uplink interference due to the closeness of Tx0 and Tx1 antennas.

In summary, application of the NR uplink codebook to UE with arbitrary antenna spacing will result in poor uplink performance. Accordingly, embodiments described herein address this issue with several solutions.

One solution to address arbitrary spacing of antenna spacing is to define a codebook with a larger number of precoder candidates. A larger set may sufficiently cover the radiating spatial domain even for non-uniformly placed antenna arrays. However, a drawback of a larger codebook is that the overhead of the feedback is also large. Besides, the computing cost at the gNB to determine an optimal precoder candidate for a specific UE also increases with a larger codebook. Considering that the gNB will support all UEs in its coverage, the increasing computational complexity at the gNB may be significant. As such, certain embodiments provide more optimal solutions than increasing the number of precoder candidates.

Certain embodiments may address at least the issue of uplink codebook design for non-uniformly placed antenna arrays. Some embodiments described herein may use a 1-D array as an example to illustrate embodiments. However, embodiments are not limited to this example; for instance, some embodiments may utilize a 2-D (or other size) array.

Therefore, certain embodiments may provide procedures at a gNB and a UE, along with a new codebook scheme. For example, an embodiment may provide a design of a UE-specific codebook for non-uniform antenna spacing, In addition, some embodiments may provide a compensation method for UE non-uniform antenna spacing by estimating DL CSI-RS with Rx antenna switching. Further, some embodiments may allow a gNB to estimate the UE specific antenna spacing information from SRS and signal such information to UE.

As introduced above, one embodiment provides a UE specific codebook for non-uniform antenna spacing. Assuming the antenna spacing of W antennas of a linear array is $d_0$, $d_1, \ldots, d_{N-1}$, where $d_n$ is the distance from the n-th antenna to the 0-th antenna. The emission pattern is the following:

$$y(\theta) = \sum_{n=0}^{N-1} w_n e^{j2\pi \frac{d_n}{\lambda} \sin\theta}$$

If weight $w_n$ of the n-th element uses the precoding weights, as indicated in FIG. 4 and FIG. 5, the resulting emission pattern may have poor performance. Instead, according to an embodiment, a new set of UE specific precoders may be defined based on the UE specific antenna spacing.

Figure 6:
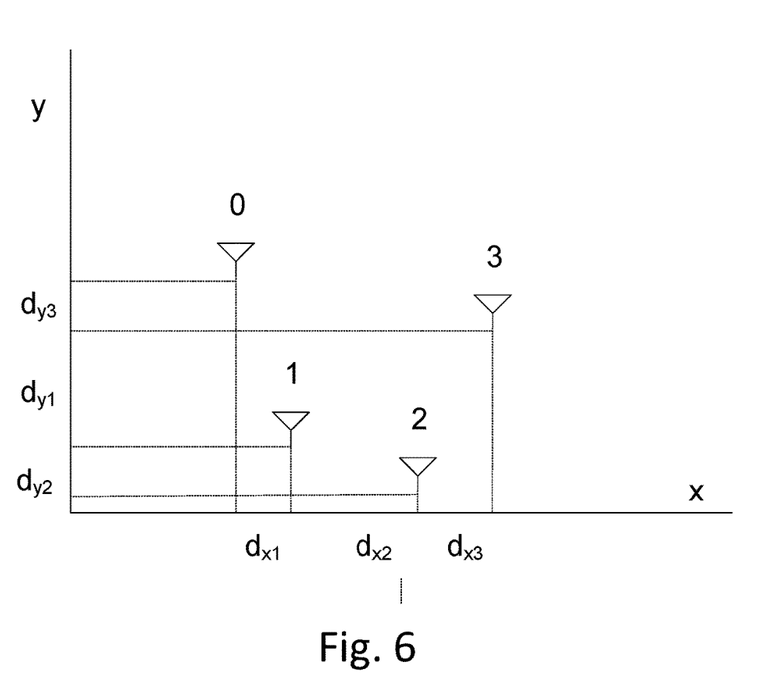
FIG. 6 illustrates an example UE antenna array that is placed in a 2-D plane, according to an embodiment.

When UE antenna array is placed in a 2-D plane with arbitrary locations in both x-axis and y-axis, as illustrated in the example of FIG. 6, the antenna array can be mapped to the two reference axes with antenna distances or spacing. Two emission patterns can be formulated in x-axis and y-axis, respectively. As shown in FIG. 6, the distance in x-axis (d_x1, d_x2, d_x3) can formulate an emission pattern related to x-axis; and the distance in y-axis (d_y1, d_y2, d_y3) can formulate an emission pattern related to y-axis. Kronecker product may be applied to yield a 3-D emission pattern with two AoA parameters.

In an embodiment, the UE specific codebook design may be based on target emission angle θ, related to the intended direction. The seof emission angles may be based on the existing NR uplink codebook. For example, for the 4Tx codebook outlined above, the target angle may be θ∈{0°, 30°, 90°, −30°}. With this, the design of the codebook becomes the solution of the following equation:

$y=Fw,$ where $w=(w_0, \ldots, w_{N-1})^T$, $y=(y(\theta_0), \ldots, y(\theta_{N-1}))^T$, and a non-uniform sampled Fourier matrix:

$$F = \begin{bmatrix} e^{j2\pi \frac{d_0}{\lambda} \sin\theta_0} & \cdots & e^{j2\pi \frac{d_{N-1}}{\lambda} \sin\theta_0} \\ \vdots & \ddots & \vdots \\ e^{j2\pi \frac{d_0}{\lambda} \sin\theta_{N-1}} & \cdots & e^{j2\pi \frac{d_{N-1}}{\lambda} \sin\theta_{N-1}} \end{bmatrix}.$$

In certain embodiments, the non-uniform sampled Fourier matrix is a function of antenna spacing, $d_0, d_1, \ldots, d_{N-1}$, where these distances are not constant. It is noted that the desired response $y(\theta_n)$ may be specified for one intended precoder of codebook. For instance, one example desired response is y=(1, 0, 0, 0), for θ=(0°, 30°, 90°, −30°), indicating a desired emission pattern at 0° degree.

According to an embodiment, the precoding vector w can be resolved with desired response $y(\theta_n)$ at various target directions:

$$\hat{w} = F^{-1} y, \text{ or}$$

$$\hat{w} = F^H (FF^H)^{-1} y$$

A more general case is that the number of target angles can be different from N number of antenna port. If the number of target angles is M, and usually M>N, the non-uniform sampled Fourier matrix F becomes an M×N matrix, with target angles $(\theta_0, \theta_1, \ldots, \theta_{M-1})$. With this, the weights are:

$\hat{w}=(F^*F)^{-1}F^*y$

If the distance between any two neighbouring antennas is not zero, it can be shown that matrix F is not ill-conditioned. According to an embodiment, since the antenna distance information $\{d_n\}$ can be UE specific, the derived codebook w will also be UE specific.

In one embodiment, the UE specific codebook design may require knowledge of the UE antenna spacing information $d_n$, which the UE may or may not have. If the UE does know its antenna array geometry, the UE may signal the information to the gNB during the configuration process or the device registration process at the higher layer. Since this process only needs to be done once, such information can be saved in the gNB as the UE's "profile".

If the UE does not know its antenna array geometry, certain embodiments may provide at least two approaches for the UE to estimate the antenna spacing information. In one embodiment, the UE can use Rx antenna switching or Rx precoding switching to detect one CSI-RS transmission in downlink to estimate UE's Tx antenna spacing. In another embodiment, the gNB can estimate UE specific antenna spacing information from SRS, and the gNB can signal such information to the UE in downlink.

According to an embodiment, for TDD, when each of the UE Tx antennas may also be used as a Rx antenna, the UE may be configured to estimate its antenna spacing with receipt of a DL transmission (e.g., CSI-RS) by switching its Rx antennas or Rx precoding.

In certain embodiments, a gNB can estimate antenna spacing from SRS and signal it to the UE. For example, a UE may transmit SRS with a rotation of precoders from the regular codebook to the gNB. Based on multiple receipts of SRS transmission, the gNB may then estimate the antenna spacing information.

Figure 7A:
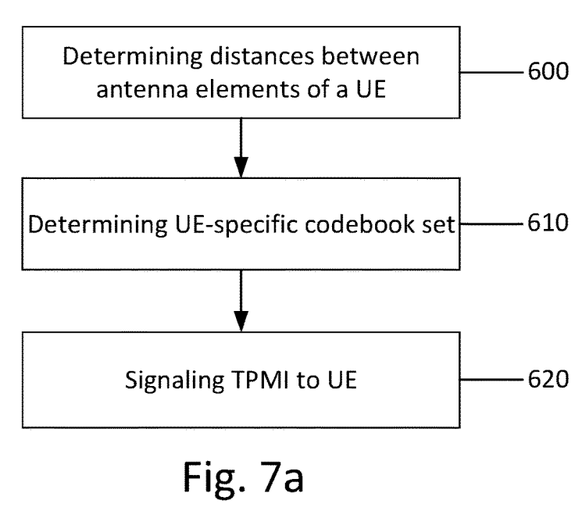
FIG. 7a illustrates an example flow diagram of a method, according to one embodiment.

FIG. 7a illustrates an example flow diagram of a method for designing or obtaining a UE-specific codebook at gNB, according to certain example embodiment. In certain example embodiments, the flow diagram of FIG. 7a may be performed by a network entity or network node in a 3GPP system, such as LTE or 5G NR. For instance, in some example embodiments, the method of FIG. 7a may be performed by a base station, eNB, gNB, or an access node or the like in a 5G or NR system.

In one embodiment, the method of FIG. 7a may include, at 600, determining the spacing or distances between antenna elements of a UE. According to certain embodiments, the determining 600 may include receiving UE antenna spacing information and/or estimating the UE antenna spacing information. For instance, the UE antenna spacing information may include or may refer to the distances between UE transmit antennas. In an embodiment, the spacing or distances between the UE antennas are not constant.

According to an embodiment, the method may further include, at 610, determining a UE-specific codebook set based on a predetermined criterion, such as desired angles. It is noted that the UE may be made aware of the predetermined criterion via high layer configuration. In one embodiment, the determining 610 of the UE-specific codebook may include determining a set of UE-specific precoders based on the UE antenna spacing information (e.g., based on the distance or spacing between antenna elements of the UE). According to some embodiments, the UE-specific precoders may include or refer to UE-specific precoding weights. In one embodiment, the determining 610 may include obtaining the UE-specific precoders by applying a non-uniform sampled Fourier matrix to a desired emission pattern. For instance, according to an embodiment, the UE-specific precoders may be obtained based on the following equation:

$y=Fw,$ where y is the desired emission pattern, F is the non-uniform sampled Fourier matrix, and w is the precoding weights. In an embodiment, the non-uniform sampled Fourier matrix, F, may be obtained according to the following:

$$F = \begin{bmatrix} e^{j2\pi \frac{d_0}{\lambda} \sin\theta_0} & \cdots & e^{j2\pi \frac{d_{N-1}}{\lambda} \sin\theta_0} \\ \vdots & \ddots & \vdots \\ e^{j2\pi \frac{d_0}{\lambda} \sin\theta_{N-1}} & \cdots & e^{j2\pi \frac{d_{N-1}}{\lambda} \sin\theta_{N-1}} \end{bmatrix},$$

where $d_n$, is the distance from the n-th antenna to the 0-th antenna.

According to some embodiments, the determining 600 of the UE antenna spacing information may include estimating, by a gNB, the spacing or distances between the UE antennas based on multiple receipts of SRS.

In certain embodiments, the method may also include, at 620, signaling transmit precoder matrix indicator (TPMI) to the UE to select one precoder for its codebook. For instance, in an embodiment, the signaling 620 may include signaling the UE-specific precoders and/or the estimated UE antenna spacing information to the UE. For example, when the gNB estimates the UE antenna spacing information from SRS, the signaling 620 may include the gNB signaling the antenna spacing information to the UE.

Figure 7B:
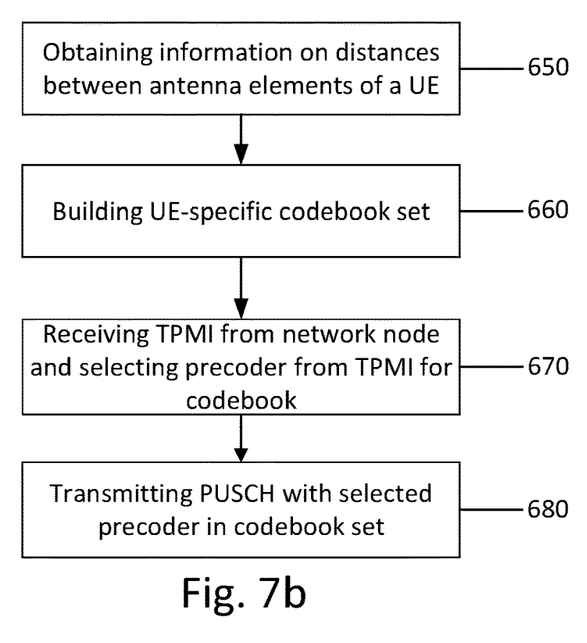
FIG. 7b illustrates an example flow diagram of a method, according to an embodiment.

FIG. 7b illustrates an example flow diagram of a method for designing or obtaining a UE-specific codebook, according to certain example embodiment. In an example embodiment, the method of FIG. 7b may be performed by a mobile station or UE associated with a communications system, such as a 5G or NR system. In an embodiment, the method may include, at 650, obtaining information about UE antenna spacing or geometry, e.g., information on distances between antenna elements of the UE.

According to some embodiments, the obtaining 650 of the UE antenna spacing information may include estimating, by the UE, the distances between the UE antennas with receipt of a DL transmission by switching the UE's receiver antennas or switching receiver precoding. In another embodiment, the obtaining 650 of the UE antenna spacing information may include receiving the antenna spacing information from the network.

In certain embodiments, the method may also include, at 670, receiving TPMI from the network and selecting one precoder from the TPMI for its codebook. The method may also include, at 680, transmitting PUSCH with the selected precoder in the UE's codebook set. In one embodiment, when the UE estimates or knows its antenna spacing information, the method may include signaling the UE antenna spacing information to the network (e.g., to the gNB).

Figure 8A:
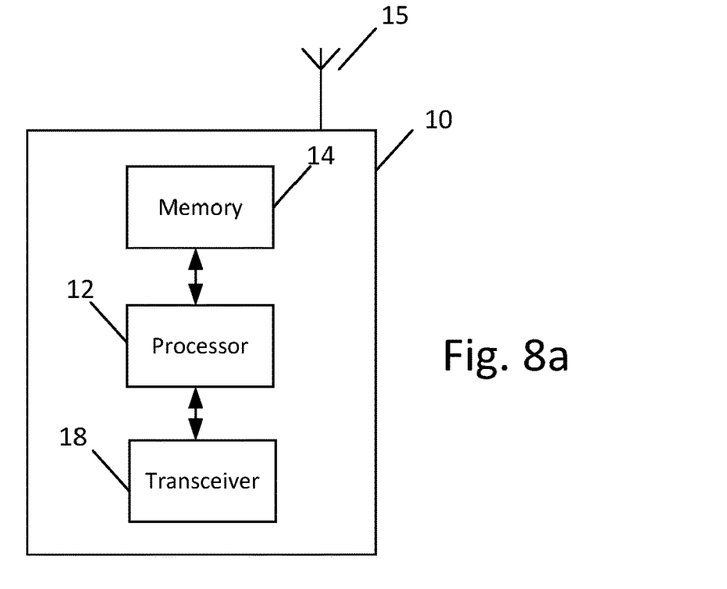
FIG. 8a illustrates an example block diagram of an apparatus, according to one embodiment.

FIG. 8a illustrates an example of an apparatus 10 according to an embodiment. In an embodiment, apparatus 10 may be a node, host, or server in a communications network or serving such a network. For example, apparatus 10 may be a base station, a Node B, an evolved Node B (eNB), 5G Node B or access point, next generation Node B (NG-NB or gNB), WLAN access point, mobility management entity (MME), and/or subscription server associated with a radio access network, such as a GSM network, LTE network, 5G or NR.

It should be understood that, in some example embodiments, apparatus 10 may be comprised of an edge cloud server as a distributed computing system where the server and the radio node may be stand-alone apparatuses communicating with each other via a radio path or via a wired connection, or they may be located in a same entity communicating via a wired connection. For instance, in certain example embodiments where apparatus 10 represents a gNB, it may be configured in a central unit (CU) and distributed unit (DU) architecture that divides the gNB functionality. In such an architecture, the CU may be a logical node that includes gNB functions such as transfer of user data, mobility control, radio access network sharing, positioning, and/or session management, etc. The CU may control the operation of DU(s) over a front-haul interface. The DU may be a logical node that includes a subset of the gNB functions, depending on the functional split option. It should be noted that one of ordinary skill in the art would understand that apparatus 10 may include components or features not shown in FIG. 8a.

As illustrated in the example of FIG. 8a, apparatus 10 may include a processor 12 for processing information and executing instructions or operations. Processor 12 may be any type of general or specific purpose processor. In fact, processor 12 may include one or more of general-purpose computers, special purpose computers, microprocessors, digital signal processors (DSPs), field-programmable gate arrays (FPGAs), application-specific integrated circuits (ASICs), and processors based on a multi-core processor architecture, as examples. While a single processor 12 is shown in FIG. 8a, multiple processors may be utilized according to other embodiments. For example, it should be understood that, in certain embodiments, apparatus 10 may include two or more processors that may form a multiprocessor system (e.g., in this case processor 12 may represent a multiprocessor) that may support multiprocessing. In certain embodiments, the multiprocessor system may be tightly coupled or loosely coupled (e.g., to form a computer cluster).

Processor 12 may perform functions associated with the operation of apparatus 10, which may include, for example, precoding of antenna gain/phase parameters, encoding and decoding of individual bits forming a communication message, formatting of information, and overall control of the apparatus 10, including processes related to management of communication resources.

Apparatus 10 may further include or be coupled to a memory 14 (internal or external), which may be coupled to processor 12, for storing information and instructions that may be executed by processor 12. Memory 14 may be one or more memories and of any type suitable to the local application environment, and may be implemented using any suitable volatile or nonvolatile data storage technology such as a semiconductor-based memory device, a magnetic memory device and system, an optical memory device and system, fixed memory, and/or removable memory. For example, memory 14 can be comprised of any combination of random access memory (RAM), read only memory (ROM), static storage such as a magnetic or optical disk, hard disk drive (HDD), or any other type of non-transitory machine or computer readable media. The instructions stored in memory 14 may include program instructions or computer program code that, when executed by processor 12, enable the apparatus 10 to perform tasks as described herein.

In an embodiment, apparatus 10 may further include or be coupled to (internal or external) a drive or port that is configured to accept and read an external computer readable storage medium, such as an optical disc, USB drive, flash drive, or any other storage medium. For example, the external computer readable storage medium may store a computer program or software for execution by processor 12 and/or apparatus 10.

In some embodiments, apparatus 10 may also include or be coupled to one or more antennas 15 for transmitting and receiving signals and/or data to and from apparatus 10. Apparatus 10 may further include or be coupled to a transceiver 18 configured to transmit and receive information. The transceiver 18 may include, for example, a plurality of radio interfaces that may be coupled to the antenna(s) 15. The radio interfaces may correspond to a plurality of radio access technologies including one or more of GSM, NB-IoT, LTE, 5G, WLAN, Bluetooth, BT-LE, NFC, radio frequency identifier (RFID), ultrawideband (UWB), MulteFire, and the like. The radio interface may include components, such as filters, converters (for example, digital-to-analog converters and the like), mappers, a Fast Fourier Transform (FFT) module, and the like, to generate symbols for a transmission via one or more downlinks and to receive symbols (for example, via an uplink).

As such, transceiver 18 may be configured to modulate information on to a carrier waveform for transmission by the antenna(s) 15 and demodulate information received via the antenna(s) 15 for further processing by other elements of apparatus 10. In other embodiments, transceiver 18 may be capable of transmitting and receiving signals or data directly. Additionally or alternatively, in some embodiments, apparatus 10 may include an input and/or output device (I/O device).

In an embodiment, memory 14 may store software modules that provide functionality when executed by processor 12. The modules may include, for example, an operating system that provides operating system functionality for apparatus 10. The memory may also store one or more functional modules, such as an application or program, to provide additional functionality for apparatus 10. The components of apparatus 10 may be implemented in hardware, or as any suitable combination of hardware and software.

According to some embodiments, processor 12 and memory 14 may be included in or may form a part of processing circuitry or control circuitry. In addition, in some embodiments, transceiver 18 may be included in or may form a part of transceiving circuitry.

As used herein, the term "circuitry" may refer to hardware-only circuitry implementations (e.g., analog and/or digital circuitry), combinations of hardware circuits and software, combinations of analog and/or digital hardware circuits with software/firmware, any portions of hardware processor(s) with software (including digital signal processors) that work together to case an apparatus (e.g., apparatus 10) to perform various functions, and/or hardware circuit(s) and/or processor(s), or portions thereof, that use software for operation but where the software may not be present when it is not needed for operation. As a further example, as used herein, the term "circuitry" may also cover an implementation of merely a hardware circuit or processor (or multiple processors), or portion of a hardware circuit or processor, and its accompanying software and/or firmware. The term circuitry may also cover, for example, a baseband integrated circuit in a server, cellular network node or device, or other computing or network device.

As introduced above, in certain embodiments, apparatus 10 may be a network node or RAN node, such as a base station, access point, Node B, eNB, gNB, WLAN access point, or the like. According to certain embodiments, apparatus 10 may be controlled by memory 14 and processor 12 to perform the functions associated with any of the embodiments described herein, such as the flow or signaling diagrams illustrated in FIG. 7a or 7b. In some embodiments, apparatus 10 may be configured to perform a procedure for designing or obtaining a UE-specific codebook. In an embodiment, the UE specific codebook design may be based on target emission angle θ, related to the intended direction. The set of emission angles may be based on the existing NR uplink codebook. For example, for the 4Tx codebook discussed in the foregoing, the target angle may be θ∈{0°, 30°, 90°, −30°}. According to certain embodiments, the UE-specific codebook design may be based on knowledge of UE antenna spacing information.

For instance, in one embodiment, apparatus 10 may be controlled by memory 14 and processor 12 to determine the spacing or distances between antenna elements of a UE. According to an embodiment, the determining of the spacing or distances between antenna elements may include apparatus 10 being controlled to receive and/or estimate UE antenna spacing information. For example, the UE antenna spacing information may include or may refer to the distances between UE transmit antennas. In an embodiment, the spacing or distances between the UE antennas are not constant.

According to some embodiments, when a UE knows or can estimate its antenna spacing information, apparatus 10 may be controlled by memory 14 and processor 12 to receive the antenna spacing information from the UE. In certain embodiments, apparatus 10 may be controlled by memory 14 and processor 12 to estimate the UE antenna spacing information based on multiple receipts of SRS. In this case, apparatus 10 may be further controlled by memory 14 and processor 12 to transmit the estimated antenna spacing information to the UE.

According to an embodiment, apparatus 10 may be controlled by memory 14 and processor 12 to determine a UE-specific codebook set based on a predetermined criterion, such as the desired angles. In one embodiment, apparatus 10 may be controlled by memory 14 and processor 12 to determine the UE-specific codebook set by determining a set of UE-specific precoders based on the UE antenna spacing information (e.g., based on the distance between antenna elements of the UE). In one embodiment, apparatus 10 may be controlled by memory 14 and processor 12 to determine the UE-specific precoders by applying a non-uniform sampled Fourier matrix to a desired emission pattern. For instance, according to an embodiment, apparatus 10 may be controlled by memory 14 and processor 12 to obtain the UE-specific precoders according to the following equation:

$$y = Fw,$$

where y is the desired emission pattern, F is the non-uniform sampled Fourier matrix, and w is the precoding weights. In an embodiment, the non-uniform sampled Fourier matrix, F, may be obtained according to the following:

$$F = \begin{bmatrix} e^{j2\pi \frac{d_0}{\lambda} \sin\theta_0} & \cdots & e^{j2\pi \frac{d_{N-1}}{\lambda} \sin\theta_0} \\ \vdots & \ddots & \vdots \\ e^{j2\pi \frac{d_0}{\lambda} \sin\theta_{N-1}} & \cdots & e^{j2\pi \frac{d_{N-1}}{\lambda} \sin\theta_{N-1}} \end{bmatrix},$$

where $d_n$ is the distance from the n-th antenna to the 0-th antenna.

In certain embodiments, apparatus 10 may be controlled by memory 14 and processor 12 to signal TPMI to the UE to select one precoder for its codebook. For instance, in an embodiment, apparatus 10 may be controlled by memory 14 and processor 12 to signal the UE-specific precoders and/or the estimated UE antenna spacing information to the UE.

Figure 8B:
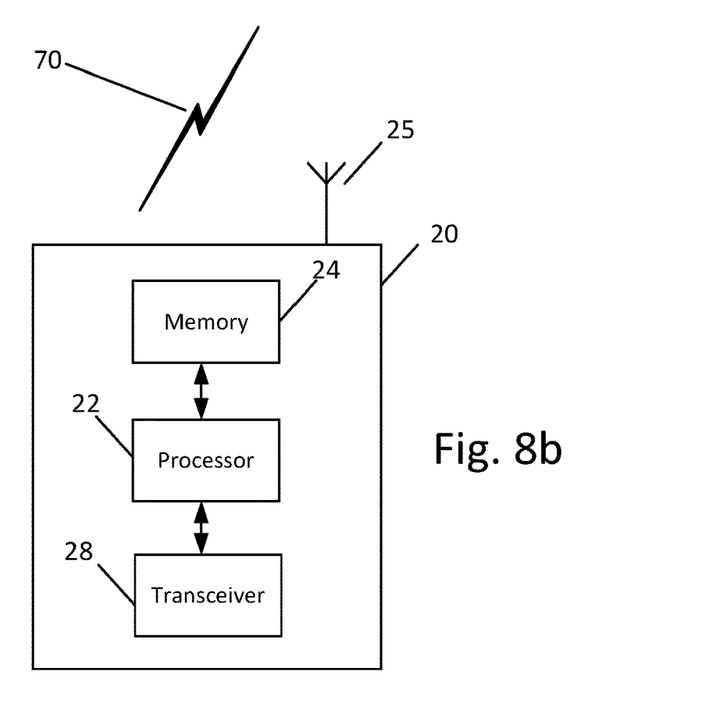
FIG. 8b illustrates an example block diagram of an apparatus, according to another embodiment.

FIG. 8b illustrates an example of an apparatus 20 according to another embodiment. In an embodiment, apparatus 20 may be a node or element in a communications network or associated with such a network, such as a UE, mobile equipment (ME), mobile station, mobile device, stationary device, IoT device, or other device. As described herein, UE may alternatively be referred to as, for example, a mobile station, mobile equipment, mobile unit, mobile device, user device, subscriber station, wireless terminal, tablet, smart phone, IoT device or NB-IoT device, or the like. As one example, apparatus 20 may be implemented in, for instance, a wireless handheld device, a wireless plug-in accessory, or the like.

In some example embodiments, apparatus 20 may include one or more processors, one or more computer-readable storage medium (for example, memory, storage, or the like), one or more radio access components (for example, a modem, a transceiver, or the like), and/or a user interface. In some embodiments, apparatus 20 may be configured to operate using one or more radio access technologies, such as GSM, LTE, LTE-A, NR, 5G, WLAN, WiFi, NB-IoT, Bluetooth, NFC, MulteFire, and/or any other radio access technologies. It should be noted that one of ordinary skill in the art would understand that apparatus 20 may include components or features not shown in FIG. 8b.

As illustrated in the example of FIG. 8b, apparatus 20 may include or be coupled to a processor 22 for processing information and executing instructions or operations. Processor 22 may be any type of general or specific purpose processor. In fact, processor 22 may include one or more of general-purpose computers, special purpose computers, microprocessors, digital signal processors (DSPs), field-programmable gate arrays (FPGAs), application-specific integrated circuits (ASICs), and processors based on a multi-core processor architecture, as examples. While a single processor 22 is shown in FIG. 8b, multiple processors may be utilized according to other embodiments. For example, it should be understood that, in certain embodiments, apparatus 20 may include two or more processors that may form a multiprocessor system (e.g., in this case processor 22 may represent a multiprocessor) that may support multiprocessing. In certain embodiments, the multiprocessor system may be tightly coupled or loosely coupled (e.g., to form a computer cluster).

Processor 22 may perform functions associated with the operation of apparatus 20 including, as some examples, precoding of antenna gain/phase parameters, encoding and decoding of individual bits forming a communication message, formatting of information, and overall control of the apparatus 20, including processes related to management of communication resources.

Apparatus 20 may further include or be coupled to a memory 24 (internal or external), which may be coupled to processor 22, for storing information and instructions that may be executed by processor 22. Memory 24 may be one or more memories and of any type suitable to the local application environment, and may be implemented using any suitable volatile or nonvolatile data storage technology such as a semiconductor-based memory device, a magnetic memory device and system, an optical memory device and system, fixed memory, and/or removable memory. For example, memory 24 can be comprised of any combination of random access memory (RAM), read only memory (ROM), static storage such as a magnetic or optical disk, hard disk drive (HDD), or any other type of non-transitory machine or computer readable media. The instructions stored in memory 24 may include program instructions or computer program code that, when executed by processor 22, enable the apparatus 20 to perform tasks as described herein.

In an embodiment, apparatus 20 may further include or be coupled to (internal or external) a drive or port that is configured to accept and read an external computer readable storage medium, such as an optical disc, USB drive, flash drive, or any other storage medium. For example, the external computer readable storage medium may store a computer program or software for execution by processor 22 and/or apparatus 20.

In some embodiments, apparatus 20 may also include or be coupled to one or more antennas 25 for receiving a downlink signal and for transmitting via an uplink from apparatus 20. Apparatus 20 may further include a transceiver 28 configured to transmit and receive information. The transceiver 28 may also include a radio interface (e.g., a modem) coupled to the antenna 25. The radio interface may correspond to a plurality of radio access technologies including one or more of GSM, LTE, LTE-A, 5G, NR, WLAN, NB-IoT, Bluetooth, BT-LE, NFC, RFID, UWB, and the like. The radio interface may include other components, such as filters, converters (for example, digital-to-analog converters and the like), symbol demappers, signal shaping components, an Inverse Fast Fourier Transform (IFFT) module, and the like, to process symbols, such as OFDMA symbols, carried by a downlink or an uplink.

For instance, transceiver 28 may be configured to modulate information on to a carrier waveform for transmission by the antenna(s) 25 and demodulate information received via the antenna(s) 25 for further processing by other elements of apparatus 20. In other embodiments, transceiver 28 may be capable of transmitting and receiving signals or data directly. Additionally or alternatively, in some embodiments, apparatus 10 may include an input and/or output device (I/O device). In certain embodiments, apparatus 20 may further include a user interface, such as a graphical user interface or touchscreen.

In an embodiment, memory 24 stores software modules that provide functionality when executed by processor 22. The modules may include, for example, an operating system that provides operating system functionality for apparatus 20. The memory may also store one or more functional modules, such as an application or program, to provide additional functionality for apparatus 20. The components of apparatus 20 may be implemented in hardware, or as any suitable combination of hardware and software. According to an example embodiment, apparatus 20 may optionally be configured to communicate with apparatus 10 via a wireless or wired communications link 70 according to any radio access technology, such as NR.

According to some embodiments, processor 22 and memory 24 may be included in or may form a part of processing circuitry or control circuitry. In addition, in some embodiments, transceiver 28 may be included in or may form a part of transceiving circuitry.

As discussed above, according to some embodiments, apparatus 20 may be a UE, mobile device, mobile station, ME, IoT device and/or NB-IoT device, for example. According to certain embodiments, apparatus 20 may be controlled by memory 24 and processor 22 to perform the functions associated with example embodiments described herein. For example, in some embodiments, apparatus 20 may be configured to perform one or more of the processes depicted in any of the flow charts or signaling diagrams described herein, such as the flow diagrams illustrated in FIG. 7a or 7b. For example, in certain embodiments, apparatus 20 may be configured to perform a procedure for obtaining or designing a UE-specific codebook.

According to some embodiments, apparatus 20 may be controlled by memory 24 and processor 22 to obtain information about the antenna spacing or geometry of apparatus 20, e.g., information on distances between antenna elements of apparatus 20. For example, in an embodiment, apparatus 20 may be controlled by memory 24 and processor 22 to receive and/or estimate the antenna spacing information for apparatus 20. For instance, the antenna spacing information may include or may refer to the distances between transmit antennas of apparatus 20. In an embodiment, the spacing or distances between the transmit antennas are not constant.

According to some embodiments, apparatus 20 may know its antenna spacing information. In certain embodiments, apparatus 20 may be controlled by memory 24 and processor 22 to estimate the antenna spacing information. For example, when Tx antennas can also be used as Rx antennas, apparatus 20 may be controlled by memory 24 and processor 22 to estimate the antenna spacing information with receipt of a DL transmission, such as CSI-RS, by switching its Rx antennas or switching Rx precoding. In an embodiment, when apparatus 20 knows or has estimated the antenna spacing information, apparatus 20 may be controlled by memory 24 and processor 22 to signal the antenna spacing information to the network (e.g., to a gNB). In another embodiment, apparatus 20 may be controlled by memory 24 and processor 22 to receive the antenna spacing information from the network.

According to an embodiment, apparatus 20 may be controlled by memory 24 and processor 22 to determine a set of UE-specific precoders based on the UE antenna spacing information. In one embodiment, apparatus 20 may be controlled by memory 24 and processor 22 to determine the UE-specific precoders by applying a non-uniform sampled Fourier matrix to a desired emission pattern. For instance, according to an embodiment, apparatus 20 may be controlled by memory 24 and processor 22 to obtain the UE-specific precoding weights according to the following equation:

$$y=Fw,$$

where y is the desired emission pattern, F is the non-uniform sampled Fourier matrix, and w is the precoding weights. In an embodiment, the non-uniform sampled Fourier matrix, F, may be obtained according to the following:

$$F = \begin{bmatrix} e^{j2\pi \frac{d_0}{\lambda} \sin\theta_0} & \cdots & e^{j2\pi \frac{d_{N-1}}{\lambda} \sin\theta_0} \\ \vdots & \ddots & \vdots \\ e^{j2\pi \frac{d_0}{\lambda} \sin\theta_{N-1}} & \cdots & e^{j2\pi \frac{d_{N-1}}{\lambda} \sin\theta_{N-1}} \end{bmatrix},$$

where $d_n$ is the distance from the n-th antenna to the 0-th antenna.

According to an embodiment, apparatus 20 may be controlled by memory 24 and processor 22 to receive TPMI from the network and select a precoder from the TPMI for its codebook. In one embodiment, apparatus 20 may then be controlled by memory 24 and processor 22 to transmit PUSCH with the selected precoder in the codebook set of apparatus 20.

In certain embodiments, apparatus 20 may be controlled by memory 24 and processor 22 to signal the UE-specific precoding weights and/or the estimated UE antenna spacing information to the network (e.g., to a gNB).

Therefore, certain example embodiments provide several technical improvements, enhancements, and/or advantages. For example, certain embodiments provide methods to improve codebook design. As a result of some embodiments, a solution is provided to address the issue of uplink codebook design for non-uniformly placed antenna arrays. As such, example embodiments can improve performance, latency, and/or throughput of networks and network nodes including, for example, access points, base stations/eNBs/gNBs, and mobile devices or UEs. Accordingly, the use of certain example embodiments results in improved functioning of communications networks and their nodes.

In some example embodiments, the functionality of any of the methods, processes, signaling diagrams, algorithms or flow charts described herein may be implemented by software and/or computer program code or portions of code stored in memory or other computer readable or tangible media, and executed by a processor.

In some example embodiments, an apparatus may be included or be associated with at least one software application, module, unit or entity configured as arithmetic operation(s), or as a program or portions of it (including an added or updated software routine), executed by at least one operation processor. Programs, also called program products or computer programs, including software routines, applets and macros, may be stored in any apparatus-readable data storage medium and include program instructions to perform particular tasks.

A computer program product may comprise one or more computer-executable components which, when the program is run, are configured to carry out some example embodiments. The one or more computer-executable components may be at least one software code or portions of it. Modifications and configurations required for implementing functionality of an example embodiment may be performed as routine(s), which may be implemented as added or updated software routine(s). Software routine(s) may be downloaded into the apparatus.

As an example, software or a computer program code or portions of it may be in a source code form, object code form, or in some intermediate form, and it may be stored in some sort of carrier, distribution medium, or computer readable medium, which may be any entity or device capable of carrying the program. Such carriers may include a record medium, computer memory, read-only memory, photoelectrical and/or electrical carrier signal, telecommunications signal, and software distribution package, for example. Depending on the processing power needed, the computer program may be executed in a single electronic digital computer or it may be distributed amongst a number of computers. The computer readable medium or computer readable storage medium may be a non-transitory medium.

In other example embodiments, the functionality may be performed by hardware or circuitry included in an apparatus (e.g., apparatus 10 or apparatus 20), for example through the use of an application specific integrated circuit (ASIC), a programmable gate array (PGA), a field programmable gate array (FPGA), or any other combination of hardware and software. In yet another example embodiment, the functionality may be implemented as a signal, a non-tangible means that can be carried by an electromagnetic signal downloaded from the Internet or other network.

According to an example embodiment, an apparatus, such as a node, device, or a corresponding component, may be configured as circuitry, a computer or a microprocessor, such as single-chip computer element, or as a chipset, including at least a memory for providing storage capacity used for arithmetic operation and an operation processor for executing the arithmetic operation.

One having ordinary skill in the art will readily understand that the example embodiments as discussed above may be practiced with steps in a different order, and/or with hardware elements in configurations which are different than those which are disclosed. Therefore, although some embodiments have been described based upon these example preferred embodiments, it would be apparent to those of skill in the art that certain modifications, variations, and alternative constructions would be apparent, while remaining within the spirit and scope of example embodiments. In order to determine the metes and bounds of the example embodiments, therefore, reference should be made to the appended claims.

We claim:

1. A method, comprising:
   determining, by a network node, variable spacing between antenna elements of a user equipment; and
   configuring user equipment specific precoders based on the variable spacing between the user equipment antenna elements, wherein the configuring is based on non-uniformly sampled Fourier matrix being a function of the variable spacing between antenna elements of the user equipment.

2. The method according to claim 1, wherein the determining of the variable spacing between the antenna elements is based on at least one of:
   signaling the spacing between the user equipment antennas from at least one of the user equipment and the network; and
   estimating the spacing between the user equipment antenna elements at the user equipment or the network, or knowing the spacing between the user equipment antennas at the user equipment or the network.

3. The method according to claim 1, wherein the antenna elements are transmit antennas.

4. The method according to claim 1, wherein the configuring comprises:
   obtaining the user equipment specific precoders by applying a non-uniformly sampled Fourier matrix to a desired emission pattern.

5. The method according to claim 2, wherein the estimating comprises estimating the spacing between the user equipment antenna elements with receipt of a downlink transmission by switching the user equipment's receiver antennas or switching precoders.

6. The method according to claim 2, wherein the estimating comprises estimating the spacing between the user equipment antenna elements based on multiple receipts of sounding reference signal.

7. The method according to claim 1, further comprising:
   signaling the user equipment specific precoders to another node in the network.

8. The method according to claim 1, further comprising at least one of the following:
   performing, by the user equipment, a transmission from multiple antenna elements with said precoders; and
   performing, by a network node, a reception of a transmission with said precoders at multiple antenna elements.

9. An apparatus, comprising:
   at least one processor; and
   at least one memory comprising computer program code, the at least one memory and computer program code configured, with the at least one processor, to cause the apparatus at least to
   determine variable spacing between antenna elements of a user equipment; and
   configure user equipment specific precoders based on the variable spacing between the user equipment antenna elements,
   wherein the user equipment specific precoders are configured based on non-uniformly sampled Fourier matrix being a function of the variable spacing between antenna elements of the user equipment.

10. The apparatus according to claim 9, wherein the at least one memory and computer program code are further configured, with the at least one processor, to determine the variable spacing between the antenna elements based on at least one of:
    signaling the spacing between the user equipment antennas from at least one of the user equipment and the network; and
    estimating the spacing between the user equipment antenna elements at the user equipment or the network, or knowing the spacing between the user equipment antennas at the user equipment or the network.

11. The apparatus according to claim 9, wherein the antenna elements are transmit antennas.

12. The apparatus according to claim 9, wherein the at least one memory and computer program code are further configured, with the at least one processor, to cause the apparatus at least to:
    obtain the user equipment specific precoders by applying a non-uniformly sampled Fourier matrix to a desired emission pattern.

13. The apparatus according to claim 10, wherein the at least one memory and computer program code are further configured, with the at least one processor, to cause the apparatus at least to:
    estimate the spacing between the user equipment antenna elements with receipt of a downlink transmission by switching the user equipment's receiver antennas or switching precoders.

14. The apparatus according to claim 10, wherein the at least one memory and computer program code are further configured, with the at least one processor, to cause the apparatus at least to:
    estimate the spacing between the user equipment antenna elements based on multiple receipts of sounding reference signal.

15. The apparatus according to claim 9, wherein the at least one memory and computer program code are further configured, with the at least one processor, to cause the apparatus at least to:
    signal the user equipment specific precoders to another node in the network.

16. The apparatus according to claim 9, wherein the at least one memory and computer program code are further configured, with the at least one processor, to cause the apparatus to perform at least one of the following:
    performing, by the user equipment, a transmission from multiple antenna elements with said precoders; and
    performing, by a network node, a reception of a transmission with said precoders at multiple antenna elements.

17. An apparatus, comprising:
    at least one processor; and
    at least one memory comprising computer program code, the at least one memory and computer program code configured, with the at least one processor, to cause the apparatus at least to
    estimate a set of variable spacing between antennas antenna elements of a user equipment; and
    signal the estimated variable antenna spacing to another node in the network, wherein
    the estimating comprises estimating the spacing between the user equipment antenna elements with receipt of a downlink transmission by switching the user equipment's receiver antennas or switching precoders, or
    the estimating comprises estimating the spacing between the user equipment antenna elements based on multiple receipts of sounding reference signal.

18. An apparatus according to claim 17, wherein the determination is based on estimation of the variable spacing between the antennas at the user equipment or at a gNB.

19. A method, comprising:
estimating variable spacing between antenna elements of a user equipment; and
configuring user equipment specific precoders based on the variable spacing between the user equipment antenna elements, wherein:
the estimating comprises estimating the spacing between the user equipment antenna elements with receipt of a downlink transmission by switching the user equipment's receiver antennas or switching precoders, or
the estimating comprises estimating the spacing between the user equipment antenna elements based on multiple receipts of sounding reference signal.

20. An apparatus, comprising:
at least one processor; and
at least one memory comprising computer program code,
the at least one memory and computer program code configured, with the at least one processor, to cause the apparatus at least to
determine variable spacing between antenna elements of a user equipment; and
configure user equipment specific precoders based on the variable spacing between the user equipment antenna elements,
wherein the at least one memory and computer program code are further configured, with the at least one processor, to cause the apparatus to perform at least one of
obtain the user equipment specific precoders by applying a non-uniformly sampled Fourier matrix to a desired emission pattern,
estimate the spacing between the user equipment antenna elements with receipt of a downlink transmission by switching the user equipment's receiver antennas or switching precoders; and
estimate the spacing between the user equipment antenna elements based on multiple receipts of sounding reference signal.

* * * * *